(12) United States Patent
Kim (10) Patent No.: US 11,289,273 B2
(45) Date of Patent: Mar. 29, 2022

(54) ELECTRONIC COMPONENT

(71) Applicant: SAMSUNG ELECTRO-MECHANICS CO., LTD., Suwon-si (KR)

(72) Inventor: Ho Yoon Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 48 days.

(21) Appl. No.: 16/850,583

(22) Filed: Apr. 16, 2020

(65) Prior Publication Data
US 2021/0175018 A1    Jun. 10, 2021

(30) Foreign Application Priority Data

Dec. 9, 2019   (KR) .................... 10-2019-0162559

(51) Int. Cl.
*H01G 4/248* (2006.01)
*H01G 4/012* (2006.01)
*H01G 4/30* (2006.01)

(52) U.S. Cl.
CPC .......... *H01G 4/248* (2013.01); *H01G 4/012* (2013.01); *H01G 4/30* (2013.01)

(58) Field of Classification Search
CPC ........ H01G 4/012; H01G 4/1227; H01G 4/33; H01G 4/248; H01G 4/30

See application file for complete search history.

(56) References Cited

U.S. PATENT DOCUMENTS

| 2014/0182910 A1 | 7/2014 | Ahn et al. |
| 2015/0041195 A1* | 2/2015 | Ahn .................. H01G 4/30 174/260 |

(Continued)

FOREIGN PATENT DOCUMENTS

| KR | 10-2014-0088366 A | 7/2014 |
| KR | 10-1994747 B1 | 7/2019 |

(Continued)

OTHER PUBLICATIONS

Office Action issued in corresponding Korean Patent Application No. 10-2019-0162559 dated Oct. 21, 2020, with English translation.

*Primary Examiner* — Michael P McFadden
(74) *Attorney, Agent, or Firm* — Morgan, Lewis & Bockius LLP (57) ABSTRACT

An electronic component includes a multilayer capacitor and an interposer. First and second internal electrodes of the multilayer capacitor are such that $0.95 \leq \{(Wm1+Wm2)/Wa\}/\{(Lm1+Lm2)/La\} \leq 4.93$, in which $Lm2$ is a distance between a first internal electrode and a fourth surface of a capacitor body, $Lm1$ is a distance between a second internal electrode and a third surface of the capacitor body opposite the fourth surface in a first direction, $Wm1$ is a distance between the first or second internal electrode and a second surface of the capacitor body, $Wm2$ is a distance between the first or second internal electrode and a first surface of the capacitor body opposite the second surface in a third direction, $La$ is a length in the first direction of a region of overlap of the first and second internal electrodes, and $Wa$ is a length in the third direction of the region of overlap.

22 Claims, 5 Drawing Sheets

(56) References Cited

U.S. PATENT DOCUMENTS

| | | | |
|---|---|---|---|
| 2015/0122534 A1* | 5/2015 | Park | H01G 2/065 |
| | | | 174/260 |
| 2015/0270068 A1* | 9/2015 | Hattori | H01C 1/14 |
| | | | 361/301.4 |
| 2016/0049247 A1* | 2/2016 | Kitano | H01G 4/248 |
| | | | 361/301.4 |
| 2016/0049255 A1* | 2/2016 | Sugita | H01G 4/1218 |
| | | | 361/301.4 |
| 2020/0082979 A1 | 3/2020 | Kim et al. | |
| 2020/0090864 A1 | 3/2020 | Kim et al. | |

FOREIGN PATENT DOCUMENTS

| | | |
|---|---|---|
| KR | 10-2019-0121177 A | 10/2019 |
| KR | 10-2019-0121179 A | 10/2019 |

\* cited by examiner

ELECTRONIC COMPONENT

CROSS-REFERENCE TO RELATED APPLICATION(S)

This application claims the benefit under 35 USC 119(a) of Korean Patent Application No. 10-2019-0162559 filed on Dec. 9, 2019 in the Korean Intellectual Property Office, the entire disclosure of which is incorporated herein by reference for all purposes.

BACKGROUND

1. Field

The present disclosure relates to an electronic component.

2. Description of Related Art

Multilayer capacitors are widely used as components of various electronic devices due to the small size, high capacity, and ease of mounting thereof.

Multilayer capacitors (MLCCs) have a structure in which internal electrodes having different polarities are alternately disposed between a plurality of dielectric layers, to have the dielectric layers interposed therebetween.

In this case, since the dielectric layers have piezoelectric properties through using a ferroelectric material, a piezoelectric phenomenon occurs between internal electrodes when a direct current or alternating current is applied to the multilayer capacitor, thereby expanding and contracting the volume of a capacitor body depending on frequency and generating periodic vibrations.

Such vibrations may be transmitted to a substrate through a solder connecting an external electrode of the multilayer capacitor to the substrate when mounting thereof on the substrate is performed, and thus the entire substrate may become an acoustic reflection surface that generates vibration sound that may be experienced as noise.

The vibration sound may correspond to an audible frequency causing listener discomfort, and thus, the vibration sound causing listener discomfort is known as acoustic noise.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An aspect of the present disclosure is to provide an electronic component capable of securing a predetermined level or more of moisture resistance and reducing acoustic noise.

According to an aspect of the present disclosure, an electronic component includes a multilayer capacitor including a capacitor body having first and second surfaces opposing each other in a third direction, third and fourth surfaces connected to the first and second surfaces and opposing each other in a first direction, and fifth and sixth surfaces connected to the first and second surfaces, connected to the third and fourth surfaces, and opposing each other in a second direction. The multilayer capacitor includes first and second external electrodes respectively disposed on the third and fourth surfaces of the capacitor body. An interposer is disposed on a side of the first surface of the multilayer capacitor. The capacitor body includes a plurality of dielectric layers, and pluralities of first internal electrodes and second internal electrodes alternately stacked in the second direction with the dielectric layers interposed therebetween. The plurality of first and second internal electrodes are exposed through the third and fourth surfaces of the capacitor body, respectively. When a distance between the first internal electrodes and the fourth surface of the capacitor body is defined as $Lm2$, a distance between the second internal electrodes and the third surface of the capacitor body is defined as $Lm1$, a distance between the first or second internal electrodes and the second surface of the capacitor body is defined as $Wm1$, a distance between the first or second internal electrodes and the first surface of the capacitor body is defined as $Wm2$, a length in the first direction of a region of overlap of the first and second internal electrodes is defined as $La$, and a length in the third direction of the region of overlap of the first and second internal electrodes is defined as $Wa$, $0.95 \leq \{(Wm1+Wm2)/Wa\}/\{(Lm1+Lm2)/La\} \leq 4.93$.

The interposer may include an interposer body and first and second external terminals disposed on opposing ends of the interposer body in the first direction. The first external terminal may include a first bonding portion disposed on the interposer body to be connected to the first external electrode, a first mounting portion disposed on the interposer body opposite to the first bonding portion in the third direction, and a first connection portion disposed on the interposer body to connect the first bonding portion and the first mounting portion. The second external terminal may include a second bonding portion disposed on the interposer body to be connected to the second external electrode, a second mounting portion disposed on the interposer body opposite to the second bonding portion in the third direction, and a second connection portion disposed on the interposer body to connect the second bonding portion and the second mounting portion.

The first and second external electrodes and the first and second bonding portions may be provided with a conductive adhesive disposed therebetween, respectively.

The conductive adhesive may be a high melting point solder.

The first and second external terminals may have a '['-shaped cross section and a ']'-shaped cross section, respectively.

A length of the interposer in the first direction may be less than a length of the multilayer capacitor in the first direction, and a length of the interposer in the second direction may be less than a length of the multilayer capacitor in the second direction.

The interposer body may be formed of alumina.

The first and second external electrodes may include first and second connection portions disposed on the third and fourth surfaces of the capacitor body, respectively, and first and second band portions respectively extending from the first and second connection portions to respective portions of the first surface of the capacitor body.

The electronic component may further include a plating layer disposed on surfaces of the first and second external electrodes.

The electronic component may further include a plating layer disposed on surfaces of the first and second external terminals of the interposer.

The first and second internal electrodes may be spaced evenly apart from the first and second surfaces.

In accordance with another aspect of the present disclosure, an electronic component includes a body having a plurality of first internal electrodes and a plurality of second internal electrodes that are alternately stacked to overlap with each other in a second direction, the first and second internal electrodes having dielectric layers interposed therebetween. The internal electrodes are such that $0.95 \leq \{(Wm1+Wm2)/Wa\}/\{(Lm1+Lm2)/La\} \leq 4.93$, in which Lm1 and Lm2 are distances between a region of overlap of the first and second internal electrodes and respective side surfaces of the body opposing each other in a first direction orthogonal to the second direction, La is a length of the region of overlap of the first and second internal electrodes in the first direction, Wm1 and Wm2 are distances between a region of overlap of the first and second internal electrodes and respective side surfaces of the body opposing each other in a third direction orthogonal to the first and second directions, and Wa is a length of the region of overlap of the first and second internal electrodes in the third direction.

BRIEF DESCRIPTION OF THE DRAWINGS

The above and other aspects, features, and advantages of the present disclosure will be more clearly understood from the following detailed description, taken in conjunction with the accompanying drawings, in which.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and the disclosure is not limited to those set forth herein, as the sequences may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's positional relationship to another element in the orientation illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The drawings may not be to scale, and the relative size, proportions, and depiction of elements in the drawings may be exaggerated for clarity, illustration, and convenience.

Subsequently, examples are described in further detail with reference to the accompanying drawings.

When the direction is defined to clearly describe the embodiments of the present disclosure, X, Y, and Z illustrated in the drawings respectively indicate the length direction, the width direction, and the thickness direction of the multilayer capacitor and the interposer.

In the embodiment, the Y direction may be used in the same concept as the stacking direction in which dielectric layers 111 are stacked or laminated.

Figure 1:
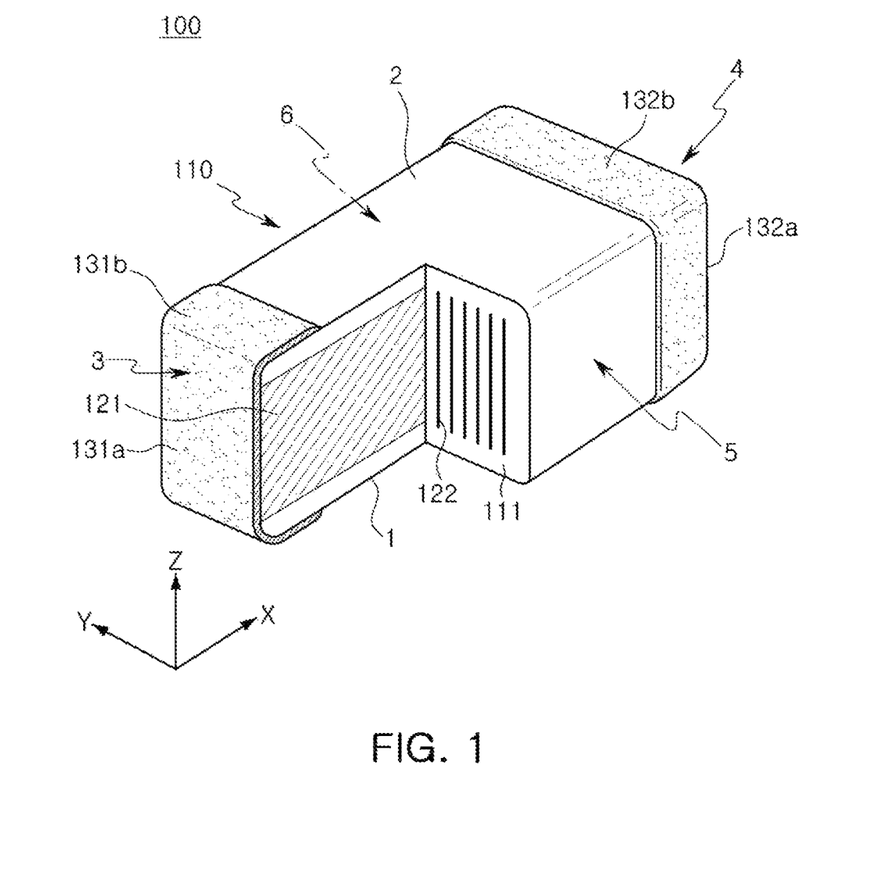
FIG. 1 is a partially cutaway perspective view illustrating a multilayer capacitor applied to an electronic component according to an embodiment of the present disclosure.
Figure 2A:
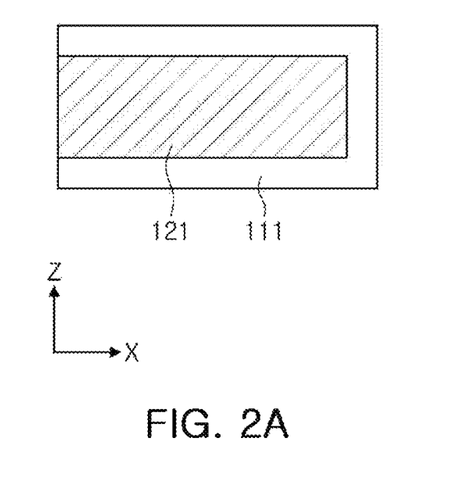
FIGS. 2A and 2B are plan views illustrating first and second internal electrodes of the multilayer capacitor of FIG. 1, respectively.
Figure 2B:
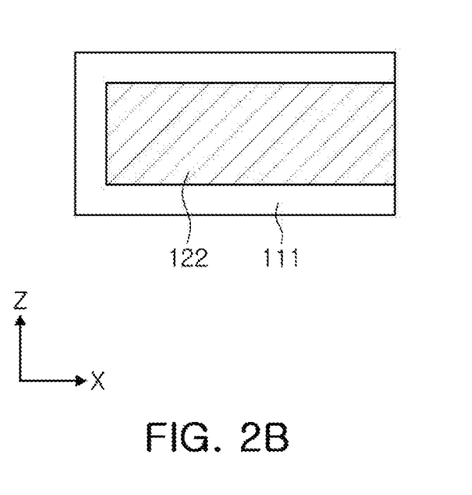

FIG. 1 is a partially cutaway perspective view of a multilayer capacitor applied to an electronic component according to an embodiment, and FIGS. 2A and 2B are plan views illustrating first and second internal electrodes of the multilayer capacitor of FIG. 1, respectively.

First, the structure of a multilayer capacitor 100 applied to an electronic component according to an embodiment will be described with reference to FIGS. 1, 2A, and 2B.

The multilayer capacitor 100 according to this embodiment includes a capacitor body 110 and first and second external electrodes 131 and 132 formed on opposing ends of the capacitor body 110 in the X direction, respectively.

The capacitor body 110 is obtained by stacking a plurality of dielectric layers 111 in the Y direction, being followed by firing, and the dielectric layers 111 of the capacitor body 110, adjacent to each other, may be integrated with each other to such an extent that the boundary therebetween is difficult to confirm without using a scanning electron microscope (SEM).

The capacitor body 110 includes a plurality of dielectric layers 111, and a plurality of first and second internal electrodes 121 and 122 having different polarities alternately disposed in the Y direction with the plurality of dielectric layer 111 interposed therebetween.

The capacitor body 110 is not particularly limited in shape, but may have a hexahedral shape, and may include first and second surfaces 1 and 2 opposing each other in the Z direction, third and fourth surfaces 3 and 4 connected to the first and second surfaces 1 and 2 and opposing each other in the X direction, and fifth and sixth surfaces 5 and 6 connected to the first and second surfaces 1 and 2, connected to the third and fourth surfaces 3 and 4, and opposing each other in the Y direction.

The capacitor body 110 may include an active region as a portion contributing to the capacitance formation of the capacitor, and a cover region provided on both sides of the capacitor body 110 in the Y direction and upper and lower portions of the active region in the Z direction, as a margin portion.

The cover region may have the same material and configuration as the dielectric layer(s) 111 except that the cover region does not include any internal electrode.

The cover region may be formed by stacking a single dielectric layer or two or more dielectric layers on both sides of the active region in the Y direction, and may basically serve to prevent damage to the first and second internal electrodes 121 and 122 due to physical or chemical stress.

The dielectric layer(s) 111 may include ceramic powder, for example, BaTiO$_3$-based ceramic powder or the like.

The BaTiO$_3$-based ceramic powder may be (Ba$_{1-x}$Ca$_x$)TiO$_3$, Ba(Ti$_{1-y}$Ca$_y$)O$_3$, (Ba$_{1-x}$Ca$_x$)(Ti$_{1-y}$Zr$_y$)O$_3$ or Ba(Ti$_{1-y}$Zr$_y$)O$_3$ in which Ca or Zr is partially solid dissolved in BaTiO$_3$, but is not limited thereto.

Along with the ceramic powder, a ceramic additive, an organic solvent, a plasticizer, a binder and a dispersant may be further added to the dielectric layer 111.

The ceramic additive may include, for example, transition metal oxide or transition metal carbide, rare earth element, magnesium (Mg) or aluminum (Al).

The first and second internal electrodes 121 and 122 are electrodes to which voltages having different polarities are applied, and may be formed on the dielectric layer 111 to be stacked in the Y direction, and may be alternately disposed to face or overlap each other (in the Y direction) with one dielectric layer 111 interposed therebetween within the capacitor body 110.

The first and second internal electrodes 121 and 122 may be electrically insulated from each other by the dielectric layer(s) 111 disposed therebetween.

On end of each of the first internal electrodes 121 may be exposed through the third surface 3 of the capacitor body 110, and one end of each of the second internal electrodes 122 may be exposed through the fourth surface 4 of the capacitor body 110.

End portions of the first and second internal electrodes 121 and 122 alternately exposed through the third and fourth surfaces 3 and 4 of the capacitor body 110 may be electrically connected to the first and second external electrodes 131 and 132 disposed on opposite ends of the capacitor body 110 in the X direction, to be described later.

In this configuration, when a predetermined voltage is applied to the first and second external electrodes 131 and 132, charges are accumulated between the first and second internal electrodes 121 and 122.

In this case, the capacitance of the multilayer capacitor 100 is proportional to the overlapped areas of the first and second internal electrodes 121 and 122 overlapping each other in the Y direction in the active region.

The material for forming the first and second internal electrodes 121 and 122 is not particularly limited. For example, the first and second internal electrodes 121 and 122 may be formed using a precious metal material such as platinum (Pt), palladium (Pd), and a palladium-silver (Pd—Ag) alloy and a conductive paste formed of at least one of nickel (Ni) and copper (Cu).

As the printing method of the conductive paste, a screen printing method or a gravure printing method may be used, but an embodiment thereof is not limited thereto.

The first and second external electrodes 131 and 132 are provided with voltages having different polarities, are disposed on opposite ends of the capacitor body 110 in the X direction, and may be electrically connected to exposed-one ends of the first and second internal electrodes 121 and 122, respectively.

The first external electrode 131 may include a first connection portion 131a and a first band portion 131b.

The first connection portion 131a is disposed on the third surface 3 of the capacitor body 110, and contacts one end of each of the first internal electrode(s) 121 exposed to the outside thereof through the third surface 3 of the capacitor body 110 to serve to electrically connect the first internal electrode(s) 121 and the first external electrode 131.

The first band portion 131b is a portion extending from the first connection portion 131a to a portion of the first surface 1 of the capacitor body 110 to be connected to a first external terminal of an interposer described later.

In this case, the first band portion 131b may further extend from the first connection portion 131a to portions of the second, fifth, and sixth surfaces 2, 5, 6 of the capacitor body 110 to improve fixing strength.

The second external electrode 132 may include a second connection portion 132a and a second band portion 132b.

The second connection portion 132a is disposed on the fourth surface 4 of the capacitor body 110 and contacts one end of each of the second internal electrode(s) 122 exposed to the outside thereof through the fourth surface 4 of the capacitor body 110 to serve to electrically connect the second internal electrode (s) 122 and the second external electrode 132 to each other.

The second band portion 132b extends from the second connection portion 132a to a portion of the first surface 1 of the capacitor body 110 to be connected to a second external terminal of the interposer, which will be described later.

In this case, the second band portion 132b may further extend from the first connection portion 132a to portions of the second, fifth and sixth surfaces 2, 5 and 6 of the capacitor body 110 to improve the fixing strength.

The first and second external electrodes 131 and 132 may further include a plating layer.

The plating layer may include first and second nickel (Ni) plating layers formed on surfaces of the first and second external electrodes 131 and 132, and first and second tin (Sn) plating layers covering the first and second nickel plating layers, respectively.

Figure 3:
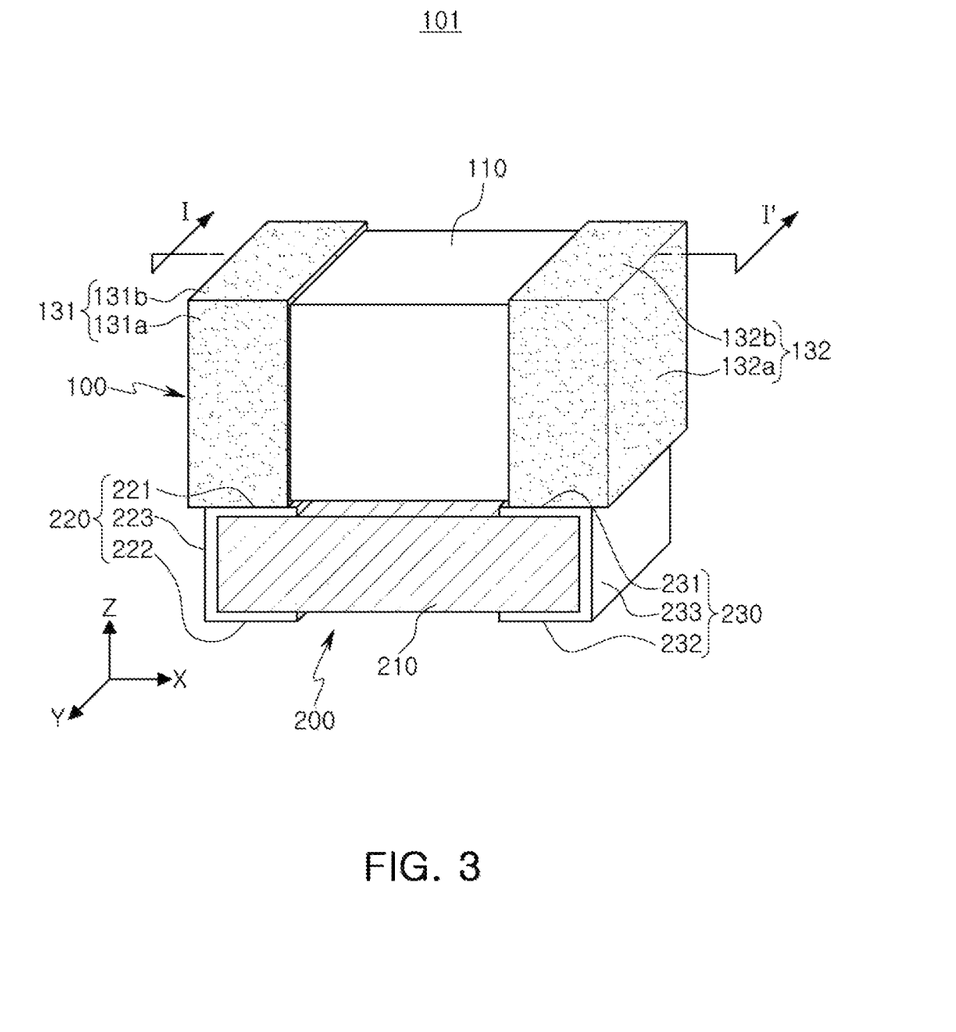
FIG. 3 is a perspective view of an electronic component according to an embodiment of the present disclosure.
Figure 4:
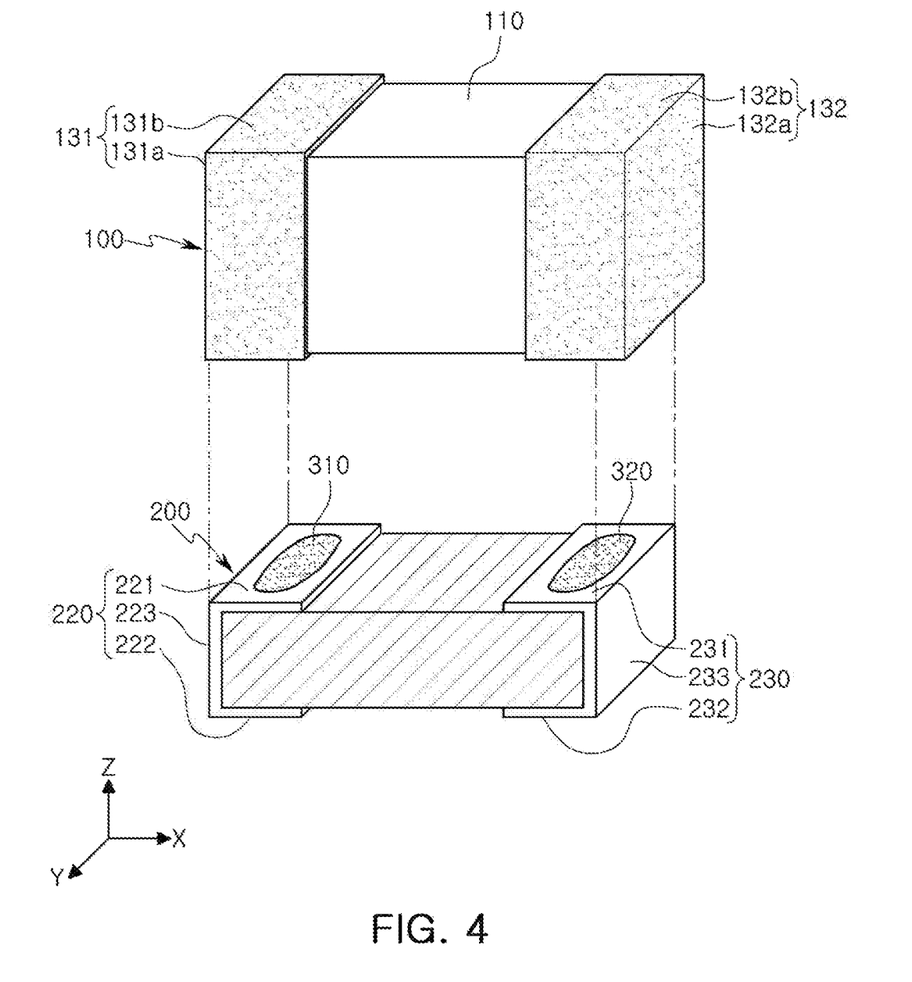
FIG. 4 is an exploded perspective view of FIG. 3.
Figure 5:
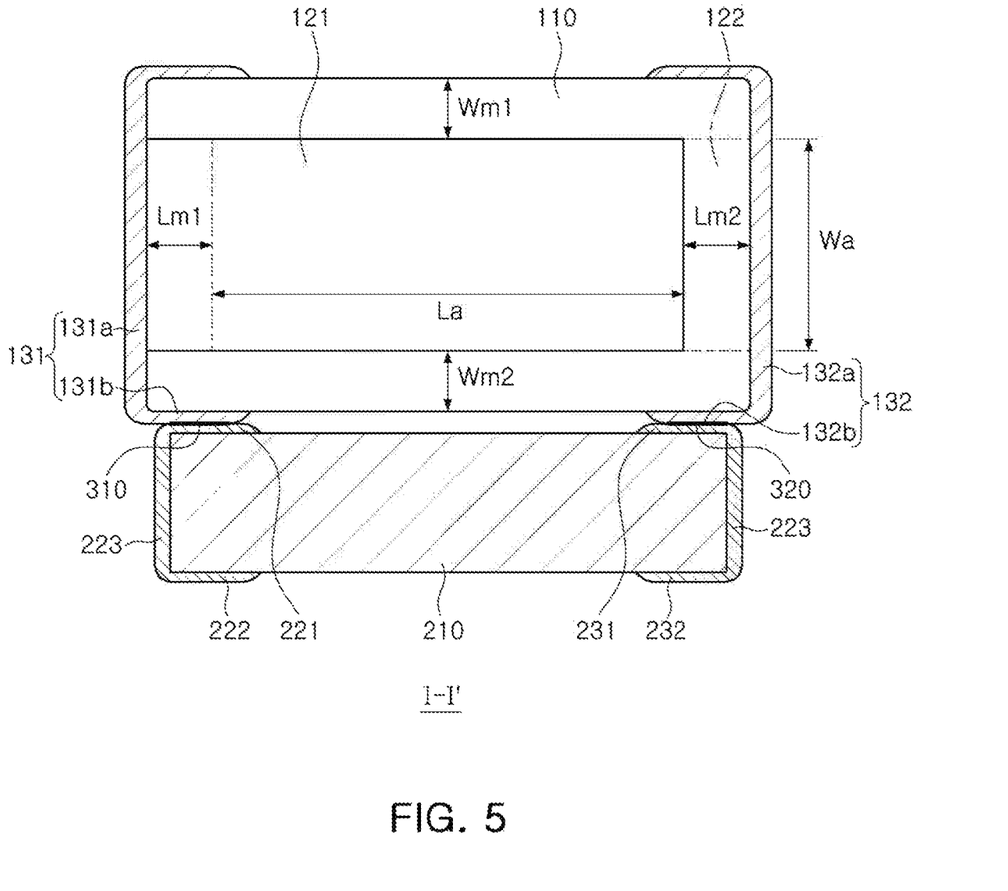
FIG. 5 is a cross-sectional view taken along line I-I' of FIG. 3.

FIG. 3 is a perspective view of an electronic component according to an embodiment, FIG. 4 is an exploded perspective view of FIG. 3, and FIG. 5 is a cross-sectional view taken along line I-I' of FIG. 3.

Referring to FIGS. 3 to 5, an electronic component 101 according to this embodiment includes a multilayer capacitor 100 and an interposer 200 disposed on the first surface (1) side of the multilayer capacitor 100.

The interposer 200 includes an interposer body 210 and first and second external terminals 220 and 230 formed on opposite ends of the interposer body 210 in the X direction.

In this case, the length of the interposer 200 may be smaller than the length of the multilayer capacitor 100, in the X direction, and the length of the interposer 200 may be smaller than the length of the multilayer capacitor 100 in the Y direction.

When the lengths of the interposer 200 are smaller than those of the multilayer capacitor 100 in the X and Y directions, a step is generated between side surfaces of the multilayer capacitor 100 and the interposer 200, and the step serves as a solder pocket configured to be filled with solder to reduce a solder height when performing mounting on the substrate, thereby reducing the height of the solder and resulting in an acoustic noise reduction effect.

The interposer body 210 may be formed of a ceramic material, and in detail, may be formed of alumina ($Al_2O_3$).

The first and second external terminals 220 and 230 are provided with voltages having different polarities, and are electrically connected to the first and second band portions 131b and 132b of the first and second external electrodes 131 and 132, respectively.

The first external terminal 220 includes a first bonding portion 221, a first mounting portion 222, and a first connection portion 223.

The first bonding portion 221 is a portion formed on the upper surface of the interposer body 210, has one end exposed through one surface of the interposer body 210 in the X direction, and is connected to the first band portion 131b of the first external electrode 131.

The first mounting portion 222 is a portion formed on the lower surface of the interposer body 210 to face or oppose the first bonding portion 221 in the Z direction, and may serve as a terminal when performing mounting on the substrate.

The first connection portion 223 is formed on one end surface of the interposer body 210 in the X direction and serves to connect the end of the first bonding portion 221 and the end of the first mounting portion 222.

Accordingly, the first external terminal 220 may be formed to have a [-shaped X-Z cross section.

A first conductive bonding agent 310 may be disposed between the first bonding portion 221 and the first band portion 131b to mechanically and electrically bond the first bonding portion 221 and the first band portion 131b to each other.

The first conductive adhesive 310 may be formed of a high melting point solder or the like.

The high melting point solder may include, for example, at least one or more of antimony (Sb), cadmium (Cd), lead (Pb), zinc (Zn), aluminum (Al), and copper (Cu).

The second external terminal 230 includes a second bonding portion 231, a second mounting portion 232, and a second connection portion 233.

The second bonding portion 231 is a portion formed on the upper surface of the interposer body 210, has one end exposed through the other surface of the interposer body 210 in the X direction, and is connected to the second band portion 132b of the second external electrode 132.

The second mounting portion 232 is a portion disposed on the lower surface of the interposer body 210 to face or oppose the second bonding portion 231 in the Z direction, and may serve as a terminal when performing mounting on a substrate.

The second connection portion 233 is formed on the other end surface of the interposer body 210 in the X direction and serves to connect the end of the second bonding portion 231 and the end of the second mounting portion 232.

Accordingly, the second external terminal 230 may be formed to have a ]-shaped X-Z cross section.

A second conductive bonding agent 320 is disposed between the second bonding portion 231 and the second band portion 132b to mechanically and electrically bond the second bonding portion 231 and the second band portion 132b to each other.

The second conductive adhesive 320 may be formed of a high melting point solder or the like.

If necessary, a plating layer may be further formed on the surfaces of the first and second external terminals 220 and 230.

The plating layer may include an inner nickel (Ni) plating layer and a tin (Sn) plating layer covering the nickel plating layer.

When voltages having different polarities are applied to the first and second external electrodes 131 and 132 formed on the electronic component 101 while the electronic component 101 is mounted on a substrate, an inverse piezoelectric effect of the dielectric layer 111 causes the capacitor body 110 to expand and contract in the Z direction.

Accordingly, both ends of the first and second external electrodes 131 and 132 contract and expand in the opposite direction to expansion and contraction of the capacitor body 110 in the Z direction by the Poisson effect. The contraction and expansion cause vibrations.

The vibrations are transmitted to the substrate through the first and second external electrodes 131 and 132 and the first and second external terminals 220 and 230, whereby sound is radiated from the substrate to become acoustic noise.

The interposer 200 according to an embodiment is attached to the first surface 1 side of the multilayer capacitor 100 facing the mounting direction to absorb vibrations of the multilayer capacitor 100 and prevent the vibration from being transmitted to the substrate.

In detail, since the multilayer capacitor 100 according to an embodiment is bonded to the interposer 200 while the internal electrodes are stacked to be perpendicular to the mounting surface of the interposer 200, the transmission of vibration to the substrate from the multilayer capacitor 100 is hindered and acoustic noise is thus reduced.

In the case of piezoelectric vibrations of the multilayer capacitor 100, phases of the Z-direction displacement and the Y and X-direction displacement are opposite to each other, and the ratio of the X-direction strain and the Z-direction strain are constant by Poisson's Ratio.

Therefore, since the ratio of the displacement in the Z direction and the displacement in the Y and X directions is constant, the Y direction displacement and the X direction displacement may be adjusted within a predetermined range by changing the internal structure and the external size of the multilayer capacitor 100.

As in this embodiment, in the case of the electronic component 101 in which the interposer 200 is disposed on the first surface 1 side of the multilayer capacitor 100 and the internal electrodes are disposed perpendicular to the interposer 200, the Z-direction amplitude and the X-direction amplitude of the multilayer capacitor 100 have relatively low contribution to vibration transmission to the substrate since there is no fixed surface.

On the other hand, since the Y-direction amplitude of the multilayer capacitor 100 transmits vibration directly to the interposer 200, the contribution to vibration transmission to the substrate is relatively high.

Therefore, in the case in which the displacement in the Y direction is reduced and the displacement in the X direction is increased by changing the internal structure and the external size of the multilayer capacitor 100, and in the case of the multilayer capacitor 100 having the same characteristics, an electronic component optimized for reducing acoustic noise may be manufactured.

In this embodiment, to reduce the size of the electronic component 101, the multilayer capacitor 100 is designed to have a size optimized for reducing the Z-direction length of the multilayer capacitor 100 and reducing acoustic noise.

To this end, when a distance between the first internal electrode 121 and the fourth surface 4 of the capacitor body 110 is defined as Lm2, a distance between the second internal electrode 122 and the third surface 3 of the capacitor body 110 is defined as Lm1, a distance between the first or second surfaces 1 and 2 of the capacitor body 110, is defined as Wa, $0.95 \leq \{(Wm1+Wm2)/Wa\}/\{(Lm1+Lm2)/La\} \leq 4.93$.

A method of reducing the displacement of the multilayer capacitor 110 in the Y direction is to increase the Wm1 or Wm2 to increase a peripheral margin without generating the piezoelectric vibration, compared to the active region that causes the piezoelectric vibration, thereby suppressing the vibrations.

In this case, the displacement suppressed in the Y direction may be switched to the X direction displacement having the same phase thereas, and Lm1 or Lm2 may be reduced to facilitate this switching.

For example, the larger the ratio (R) of (Wm1+Wm2)/Wa to (Lm1+Lm2)/La is, the more the displacement in the Y direction is suppressed, so that the acoustic noise reduction effect of the entire electronic product 101 may be improved. On the other hand, if the R value deviates from a predetermined value, a problem may occur in the moisture resistance reliability of the multilayer capacitor 100.

When the numerical limitation $0.95 \leq \{(Wm1+Wm2)/Wa\}/\{(Lm1+Lm2)/La\} \leq 4.93$ is satisfied, acoustic noise may be reduced while securing a predetermined level or more of moisture resistance reliability.

Experimental Example

Multilayer capacitors of 2.0×1.2 mm size, 22 uF, and 25V class were manufactured to have various designs as illustrated in Table 1 below, and electronic components were manufactured by bonding 1.7×1.2×0.52 mm size ceramic interposers with a high melting point solder.

Moreover, acoustic noise of the produced electronic component was measured and moisture resistance evaluation was performed.

The moisture resistance evaluation determined that no good (NG) (e.g., associated with a defect) was a case in which insulation resistance (IR) decreased by 1 order $(10^1)\Omega$ or more after applying 25V at 85° C. and 85% relative humidity (RH) for 24 hours.

Table 1 below illustrates acoustic noise and moisture resistance evaluation results according to R values. In this case, R indicates $\{(Wm1+Wm2)/Wa\}/\{(Lm1+Lm2)/La\}$.

| # | Active Region Area (mm²) | L (mm) | Lm (mm) | La (mm) | (Lm1+Lm2)/LA | W (mm) | Wm (mm) | Wa | (Wm1+Wm2)/Wa | R | Acoustic Noise (dB) | Defect in Moisture Resistance Evaluation (EA) |
|---|---|---|---|---|---|---|---|---|---|---|---|---|
| 1 | 1.55 | 2.0 | 0.240 | 1.520 | 0.316 | 1.2 | 0.090 | 1.020 | 0.176 | 0.56 | 37.4 | 23/40 |
| 2 | 1.55 | 2.0 | 0.220 | 1.560 | 0.282 | 1.2 | 0.103 | 0.994 | 0.207 | 0.73 | 36.8 | 5/40 |
| 3 | 1.55 | 2.0 | 0.200 | 1.600 | 0.250 | 1.2 | 0.115 | 0.970 | 0.237 | 0.95 | 36.2 | 0/40 |
| 4 | 1.55 | 2.0 | 0.180 | 1.640 | 0.220 | 1.2 | 0.127 | 0.946 | 0.268 | 1.22 | 34.9 | 0/40 |
| 5 | 1.55 | 2.0 | 0.160 | 1.680 | 0.190 | 1.2 | 0.140 | 0.920 | 0.304 | 1.60 | 34.0 | 0/40 |
| 6 | 1.55 | 2.0 | 0.140 | 1.720 | 0.163 | 1.2 | 0.150 | 0.900 | 0.333 | 2.05 | 32.6 | 0/40 |
| 7 | 1.55 | 2.0 | 0.120 | 1.760 | 0.136 | 1.2 | 0.160 | 0.880 | 0.364 | 2.67 | 31.8 | 0/40 |
| 8 | 1.55 | 2.0 | 0.100 | 1.800 | 0.111 | 1.2 | 0.170 | 0.860 | 0.395 | 3.56 | 30.1 | 0/40 |
| 9 | 1.55 | 2.0 | 0.080 | 1.840 | 0.087 | 1.2 | 0.180 | 0.840 | 0.429 | 4.93 | 29.5 | 0/40 |
| 10 | 1.55 | 2.0 | 0.060 | 1.880 | 0.064 | 1.2 | 0.187 | 0.826 | 0.453 | 7.09 | 28.2 | 14/40 |
| 11 | 1.55 | 2.0 | 0.040 | 1.920 | 0.042 | 1.2 | 0.197 | 0.806 | 0.489 | 11.73 | 27.7 | 40/40 | second internal electrode 121 or 122 and the second surface 2 of the capacitor body 110 is defined as Wm1, a distance between the first or second internal electrode 121 or 122 and the first surface 1 of the capacitor body 110 is defined as Wm2, a length of a portion in the X direction, in which the first and second internal electrodes 121 and 122 overlap each other, is defined as La, and a length of the portion in which the first and second internal electrodes 121 and 122 overlap, the length being in the Z direction connecting the first and Referring to Table 1, it can be seen that the acoustic noise decreases as the R value increases.

In addition, in the case of Sample 1 and Sample 2 in which R is less than 0.95, it can be confirmed that a defect occurs in the moisture resistance evaluation.

In addition, in the case of Sample 10 and Sample 11 in which R is greater than 4.93, acoustic noise showed a lowest value of less than 30 dB, but it can be seen that a failure occurred in the moisture resistance evaluation.

Therefore, in order for electronic components to reduce acoustic noise to less than 40 dB and to ensure a certain level of moisture resistance reliability, an appropriate range of $\{(Wm1+Wm2)/Wa\}/\{(Lm1+Lm2)/La\}$ satisfies 0.95 to 4.93.

As set forth above, according to an embodiment, a vertical stacked type multilayer capacitor and an interposer are included, and the ratio of the margin in the vertical to the margin of the capacitor body in the length direction is limited, thereby increasing the moisture resistance reliability of the multilayer capacitor by a predetermined level or more and reducing acoustic noise.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic component comprising:
   a multilayer capacitor including a capacitor body having first and second surfaces opposing each other in a third direction, third and fourth surfaces connected to the first and second surfaces and opposing each other in a first direction, and fifth and sixth surfaces connected to the first and second surfaces, connected to the third and fourth surfaces, and opposing each other in a second direction, the multilayer capacitor including first and second external electrodes respectively disposed on the third and fourth surfaces; and
   an interposer disposed on a side of the first surface of the multilayer capacitor,
   wherein the capacitor body includes a plurality of dielectric layers, and pluralities of first internal electrodes and second internal electrodes alternately stacked in the second direction with the dielectric layers interposed therebetween,
   the plurality of first and second internal electrodes are exposed through the third and fourth surfaces of the capacitor body, respectively,
   wherein $0.95 \leq \{(Wm1+Wm2)/Wa\}/\{(Lm1+Lm2)/La\} \leq 4.93$, in which Lm2 is a distance between the first internal electrodes and the fourth surface of the capacitor body, Lm1 is a distance between the second internal electrodes and the third surface of the capacitor body, Wm1 is a distance between the first or second internal electrodes and the second surface of the capacitor body, Wm2 is a distance between the first or second internal electrodes and the first surface of the capacitor body, La is a length in the first direction of a region of overlap of the pluralities of first and second internal electrodes, and Wa is a length in the third direction of the region of overlap of the pluralities of first and second internal electrodes, and
   wherein $0.207 \leq (Wm1+Wm2)/Wa$.

2. The electronic component of claim 1, wherein the interposer comprises an interposer body and first and second external terminals disposed on opposing ends of the interposer body in the first direction,
   wherein the first external terminal comprises a first bonding portion disposed on the interposer body to be connected to the first external electrode, a first mounting portion disposed on the interposer body opposite to the first bonding portion in the third direction, and a first connection portion disposed on the interposer body to connect the first bonding portion and the first mounting portion, and
   the second external terminal comprises a second bonding portion disposed on the interposer body to be connected to the second external electrode, a second mounting portion disposed on the interposer body opposite to the second bonding portion in the third direction, and a second connection portion disposed on the interposer body to connect the second bonding portion and the second mounting portion.

3. The electronic component of claim 2, wherein the first and second external electrodes and the first and second bonding portions are provided with a conductive adhesive disposed therebetween, respectively.

4. The electronic component of claim 3, wherein the conductive adhesive is a high melting point solder.

5. The electronic component of claim 2, wherein the first and second external terminals have a '['-shaped cross section and a ']'-shaped cross section, respectively.

6. The electronic component of claim 2, wherein the interposer body is formed of alumina.

7. The electronic component of claim 2, further comprising a plating layer disposed on surfaces of the first and second external terminals of the interposer.

8. The electronic component of claim 1, wherein a length of the interposer in the first direction is less than a length of the multilayer capacitor in the first direction, and
   a length of the interposer in the second direction is less than a length of the multilayer capacitor in the second direction.

9. The electronic component of claim 1, wherein the first and second external electrodes comprise first and second connection portions disposed on the third and fourth surfaces of the capacitor body, respectively, and first and second band portions respectively extending from the first and second connection portions to respective portions of the first surface of the capacitor body.

10. The electronic component of claim 1, further comprising a plating layer disposed on surfaces of the first and second external electrodes.

11. The electronic component of claim 1, wherein the first and second internal electrodes are spaced evenly apart from the first and second surfaces.

12. The electronic component of claim 1, wherein $0.237 \leq (Wm1+Wm2)/Wa \leq 0.429$.

13. An electronic component comprising:
    a body comprising a plurality of first internal electrodes and a plurality of second internal electrodes that are alternately stacked to overlap with each other in a second direction, the first and second internal electrodes having dielectric layers interposed therebetween,
    wherein $0.95 \leq \{(Wm1+Wm2)/Wa\}/\{(Lm1+Lm2)/La\} \leq 4.93$, in which Lm1 and Lm2 are distances between a region of overlap of the first and second internal electrodes and respective side surfaces of the body opposing each other in a first direction orthogonal to the second direction, La is a length of the region of overlap of the first and second internal electrodes in the first direction, Wm1 and Wm2 are distances between a region of overlap of the first and second internal electrodes and respective side surfaces of the body opposing each other in a third direction orthogonal to the first and second directions, and Wa is a length of the region of overlap of the first and second internal electrodes in the third direction, and wherein $0.207 \leq (Wm1+Wm2)/Wa$.

14. The electronic component of claim 13, wherein the region of overlap of the first and second internal electrodes is spaced evenly apart from the side surfaces of the body opposing each other in the third direction.

15. The electronic component of claim 13, further comprising:
   first and second external electrodes respectively disposed on the respective side surfaces of the body opposing each other in the first direction,
   wherein the first and second external electrodes respectively contact each of the first internal electrodes and each of the second internal electrodes on the respective side surfaces of the body opposing each other in the first direction.

16. The electronic component of claim 13, further comprising:
   first and second external electrodes disposed on one side surface of the side surfaces of the body opposing each other in the third direction; and
   an interposer having first and second external terminals disposed on opposing ends of the interposer body,
   wherein the first and second external terminals of the interposer are bonded to the first and second external electrodes, respectively.

17. The electronic component of claim 16, wherein a length of the interposer in the first direction is less than a length of the body in the first direction, and
   a length of the interposer in the second direction is less than a length of the body in the second direction.

18. The electronic component of claim 16, wherein the first and second external terminals are disposed on respective ends of the interposer body opposite each other in the first direction, and each extend onto both surfaces of the interposer opposite each other in the third direction.

19. The electronic component of claim 16, wherein the first and second external electrodes and the first and second external terminals are provided with a conductive adhesive disposed therebetween, respectively.

20. The electronic component of claim 13, further comprising:
   an interposer having first and second external terminals disposed on opposing ends of the interposer body,
   wherein the interposer has a first surface that is orthogonal to the first and second internal electrodes and that is bonded to the body.

21. The electronic component of claim 13, wherein $0.237 \leq (Wm1+Wm2)/Wa \leq 0.429$.

22. An electronic component comprising:
   a body comprising a plurality of first internal electrodes and a plurality of second internal electrodes that are alternately stacked to overlap with each other in a second direction, the first and second internal electrodes having dielectric layers interposed therebetween,
   wherein $1.73 \leq \{(Wm1+Wm2)/Wa\}/\{(Lm1+Lm2)/La\} \leq 4.93$, in which Lm1 and Lm2 are distances between a region of overlap of the first and second internal electrodes and respective side surfaces of the body opposing each other in a first direction orthogonal to the second direction, La is a length of the region of overlap of the first and second internal electrodes in the first direction, Wm1 and Wm2 are distances between a region of overlap of the first and second internal electrodes and respective side surfaces of the body opposing each other in a third direction orthogonal to the first and second directions, and Wa is a length of the region of overlap of the first and second internal electrodes in the third direction.

* * * * *